(12) United States Patent
Choi

(10) Patent No.: US 10,692,745 B2
(45) Date of Patent: Jun. 23, 2020

(54) SUBSTRATE PROCESSING APPARATUS

(71) Applicant: EUGENE TECHNOLOGY CO., LTD., Yongin-Si, Gyeonggi-Do (KR)

(72) Inventor: Sung Ha Choi, Yongin-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 221 days.

(21) Appl. No.: 15/853,767

(22) Filed: Dec. 23, 2017

(65) Prior Publication Data

US 2018/0277411 A1    Sep. 27, 2018

(30) Foreign Application Priority Data

Mar. 21, 2017  (KR) .................. 10-2017-0035412

(51) Int. Cl.
*H01L 21/677* (2006.01)
*H01L 21/673* (2006.01)

(52) U.S. Cl.
CPC .. *H01L 21/67712* (2013.01); *H01L 21/67303* (2013.01); *H01L 21/67309* (2013.01); *H01L 21/67757* (2013.01)

(58) Field of Classification Search
CPC .............. H01L 21/67303; H01L 21/67309
See application file for complete search history.

(56) References Cited

U.S. PATENT DOCUMENTS

| 2003/0019585 A1* | 1/2003 | Tometsuka | C23C 16/4583 156/345.51 |
|---|---|---|---|
| 2008/0035055 A1 | 2/2008 | Dip et al. | |
| 2008/0106202 A1 | 5/2008 | Du et al. | |
| 2010/0055347 A1 | 3/2010 | Kato et al. | |
| 2012/0220107 A1* | 8/2012 | Fukuda | H01L 21/67309 438/478 |
| 2017/0115063 A1* | 4/2017 | Liu | F27D 5/0037 |

FOREIGN PATENT DOCUMENTS

| JP | 2002217275 A | 8/2002 |
|---|---|---|
| JP | 2003059851 A | 2/2003 |
| JP | 2003209153 A | 7/2003 |

(Continued)

*Primary Examiner* — Dah-Wei D. Yuan
*Assistant Examiner* — Stephen A Kitt
(74) *Attorney, Agent, or Firm* — Renaissance IP Law Group LLP

(57) ABSTRACT

The present disclosure relates to a substrate processing apparatus, and more particularly, to a substrate processing apparatus capable of blocking particles falling from a lower portion of a substrate to a surface of a lower substrate.

The substrate processing apparatus in accordance with an exemplary embodiment may include a substrate boat including a plurality of hollow plates coupled to a plurality of rods in a multistage manner, wherein a plurality of substrates are respectively loaded on the plurality of hollow plates, a reaction tube having an accommodation space in which the substrate boat is accommodated, a gas supply part configured to supply a process gas into the reaction tube from one side of the reaction tube, and an exhaust part configured to exhaust a process residue in the reaction tube from the other side of the reaction tube. Each of the hollow plates may include an edge portion defining a hollow portion vertically passing therethrough.

10 Claims, 4 Drawing Sheets

(56) References Cited

FOREIGN PATENT DOCUMENTS

| | | |
|---|---|---|
| JP | 2006190760 A | 7/2006 |
| JP | 2008270652 A | 11/2008 |
| JP | 2017028260 A | 2/2017 |
| KR | 20070032801 A | 3/2007 |
| KR | 20130069310 A | 6/2013 |

* cited by examiner

SUBSTRATE PROCESSING APPARATUS

CROSS-REFERENCE TO RELATED APPLICATION

This application claims priority to Korean Patent Application No. 10-2017-0035412 filed on Mar. 21, 2017 and all the benefits accruing therefrom under 35 U.S.C. § 119, the contents of which are incorporated by reference in their entirety.

BACKGROUND

The present disclosure relates to a substrate processing apparatus, and more particularly, to a substrate processing apparatus capable of blocking particles falling from a lower portion of a substrate to a surface of a lower substrate.

In general, a substrate processing apparatus is classified into a single wafer type apparatus capable of performing a substrate processing process for one substrate and a batch type apparatus capable of simultaneously performing the substrate processing process for a plurality of substrates. Such a single wafer type substrate processing apparatus has an advantage in that is has a simple structure, but has low productivity. Thus, the batch type substrate processing apparatuses capable of being mass-producing substrates are being widely used.

The typical batch type substrate processing apparatus performs a process by vertically stacking a plurality of substrates. Here, when the substrates are loaded to or unloaded from a substrate boat, particles generated from a lower portion of the substrate or particles generated while loading the substrate in the substrate processing process may fall onto a lower substrate. To resolve this limitation, a method of blocking the particles generated from the lower portion of the substrate through a space division plate is being tried. However, the limitation, in which particles generated from the bottom surface of the space division plate or particles generated during loading fall on the substrate, is still unresolved.

In particular, deposition and etching are repeated in a selective epitaxial growth (SEG) process, in which an insulation layer such as an oxide layer and a nitride layer is formed on a predetermined area of a semiconductor substrate, the predetermined area of the semiconductor substrate is exposed, and, only in the exposed predetermined area of the semiconductor, a homogeneous or heterogeneous semiconductor layer having the same crystalline structure is grown. Due to this, particles caused by a process by-product, which are attached to the bottom surface of the space division plate during a deposition process and falling by being etched from the bottom surface of the space division plate during an etching process cause more severe limitation.

SUMMARY

The present disclosure provides a substrate processing apparatus capable of blocking particles falling on a surface of a lower substrate to prevent pollution of the lower substrate.

In accordance with an exemplary embodiment, a substrate processing apparatus includes: a substrate boat including a plurality of hollow plates coupled to a plurality of rods in a multistage manner, wherein a plurality of substrates are respectively loaded on the plurality of hollow plates; a reaction tube having an accommodation space in which the substrate boat is accommodated; a gas supply part configured to supply a process gas into the reaction tube from one side of the reaction tube; and an exhaust part configured to exhaust a process residue in the reaction tube from the other side of the reaction tube. Each of the hollow plates includes an edge portion defining a hollow portion vertically passing therethrough.

In an exemplary embodiment, the hollow plate may further include a plurality of support pins provided on a top surface of the edge portion to support the substrate.

In an exemplary embodiment, the hollow plate may further include a plurality of blocking walls respectively corresponding to the plurality of support pins and disposed more inside than the support pin on the top surface of the edge portion.

In an exemplary embodiment, the blocking wall may have a height less than that of the support pin.

In an exemplary embodiment, the hollow plate may further include a cut portion in which at least one side of the edge portion is opened.

In an exemplary embodiment, the edge portion may extend along an edge of the substrate.

In an exemplary embodiment, the hollow portion may have a surface area that is greater than that of a portion of the edge portion, which overlaps the loaded substrate.

In an exemplary embodiment, the process gas may include a thin-film deposition raw gas and an etching gas.

In an exemplary embodiment, the substrate may be a single crystal containing a first element, and the thin-film deposition raw gas may contain the first element.

In an exemplary embodiment, a plurality of slots, into which the plurality of hollow plates are inserted, may be respectively defined in the plurality of rods.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
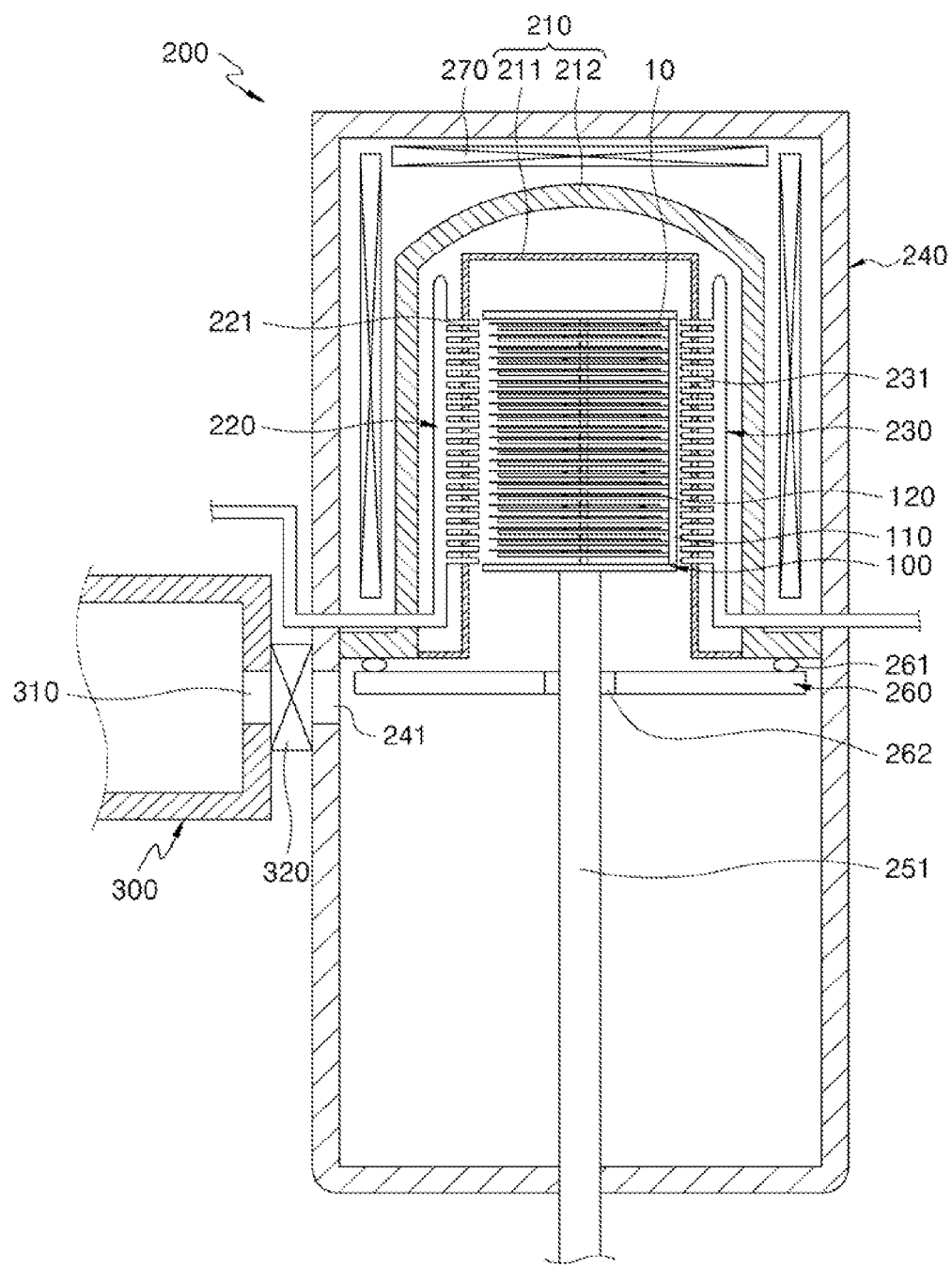
FIG. 1 is a view of a substrate processing apparatus in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity. Like reference numerals in the drawings denote like elements, and thus their description will be omitted.

FIG. 1 is a view of a substrate processing apparatus in accordance with an exemplary embodiment.

Referring to FIG. 1, a substrate processing apparatus 200 in accordance with an exemplary embodiment may include: a substrate boat 100 including a plurality of hollow plates 120 coupled to a plurality of rods 110 in a multi-stage manner, wherein a plurality of substrates 10 are respectively loaded on the plurality of hollow plates 120; a reaction tube 210 having an accommodation space for accommodating the substrate boat 100 therein; a gas supply part 220 disposed at one side of the reaction tube 210 to supply a process gas into the reaction tube 210; and a exhaust part 230 disposed at the other side of the reaction tube 210 to discharge process residues in the reaction tube 210.

The substrate boat 100 may include the plurality of hollow plates 120 coupled to the plurality of rod 110 in a multistage manner, and the plurality of substrates 10 may be respectively stacked on the plurality of hollow plates 120. That is, the plurality of hollow plates 120 may be respectively provided below the plurality of substrates 10 stacked on the substrate boat 100. Also, the substrate boat 100 may ascend to be accommodated in the accommodation space of the reaction tube 210.

Here, the plurality of rods 110 may be spaced apart from each other and installed in a vertically stand state. For example, the rod 110 may be made of quartz and have a circular horizontal cross-section, and three or more rod 110 may be provided to support the plurality of hollow plates 120.

Also, the plurality of hollow plates 120 may be respectively disposed on and coupled to the plurality of rods 110 in a multistage manner. The plurality of hollow plates 120 may be supported by the plurality of rods 110. Here, the hollow plate 120 may be welded to be fixed to the plurality of rods 110. Also, when the plurality of rods 110 and the hollow plate 120 are welded, the hollow plate 120 may be stably fixed to the plurality of rods 110 to improve structural stability. Here, the hollow plate 120 may have a shape of a plate having a predetermined thickness and be made of quartz like the rod 110. Accordingly, when welded, the plurality of rods 110 and the hollow plate 120 may be stably coupled to each other.

Also, the plurality of hollow plates 120 may be respectively disposed below the stacked plurality of substrates 10 and provided below the substrate 10 to block particles generated from a lower portion of the substrate due to a mark of contact such as friction when loading or unloading the substrate 10. Also, the hollow plates 120 may be a particle block plate blocking particles falling on the surface of the substrate 10 disposed therebelow (hereinafter, referred to as a "lower substrate").

The reaction tube 210 may accommodate the substrate boat 100 and have an accommodation space in which the substrate boat 100 is accommodated, and a process of processing the substrate 10 stacked on the substrate boat 100 may be performed therein. Here, the processing process may include a deposition process and an etching process. The reaction tube 210 may have a cylindrical shape in which an upper portion is closed, and a lower portion is opened. Here, when the substrate boat 100 vertically moves to be disposed in the accommodation space of the reaction tube 210, the substrate boat 100 may be inserted into or unloaded from the accommodation space of the reaction tube 210 through an opening of the reaction tube 210. Also, a protruding portion protruding from a circumference of the reaction tube 210 to the outside and connected to a chamber 240 may be provided so that a lower portion of the reaction tube 210 is supported by being connected to an inner wall of the chamber 240. Meanwhile, the reaction tube 210 may be made of a material such as ceramic, quartz, or metal coated with ceramic and include an inner reaction tube 211 and an outer reaction tube 212. However, an exemplary embodiment is not limited to the structure and shape of the reaction tube 210. For example, the reaction tube 210 may have various structures and shapes.

The gas supply part 220 may supply a process gas from one side of the reaction tube 210 into the reaction tube 210, supply the process gas into the reaction tube 210 through an injection nozzle 221, and supply the process gas to the substrate 10. The injection nozzle 221 may be provided at one side (or a side surface) of the reaction tube 210. The injection nozzle 221 may be one injection nozzle having a linear shape or a plurality of injection nozzles that are linearly arranged. When the injection nozzle 221 is the plurality of injection nozzles that are linearly arranged, the injection nozzle 221 may be provided to each of the substrates.

Also, the gas supply part 220 may supply the process gas to each of the substrates 10 through the plurality of injection nozzles 221. Accordingly, an equal amount (or concentration) of the process gas may be supplied to each of the substrates 10 to uniformly process the substrate over an entire surface of the substrate 10. Here, the substrate processing may include a thin-film deposition and etching. Here, the plurality of injection nozzles 221 may be respectively disposed in correspondence to the substrates 10, respectively disposed on positions greater than those of the substrates, and inject the process gas at positions higher than those of the substrate 10.

When the injection nozzle 221 is disposed lower than the substrate 10, in case of injecting the process gas, a thin-film may be deposited on a bottom surface of the substrate 10 instead of being deposited on a top surface of the substrate 10, or the process gas may affect a thin-film deposition of the lower substrate 10 Also, when the injection nozzle 221 has the same position as that of the substrate 10 to inject the process gas, a thin-film may be deposited on the top surface of the substrate 10. However, when the thin-film is deposited on the bottom surface of the substrate 10, and the process gas is supplied in a direction of the cut portion 123 of the hollow plate 120, a considerable amount of the process gas may move downward to affect the thin-film deposition of the lower substrate. Accordingly, the injection nozzle 221 may be disposed higher in position than the substrate 10 to effectively deposit a thin-film on the top surface of the substrate 10, and, through this, the process gas that is deposited on the bottom surface of the substrate 10 or affects the thin-film deposition of the lower substrate 10 may be reduced.

Also, when the injection nozzle 221 is disposed higher in position than the substrate 10, since a flow of the process gas is not affected by the substrate 10 and/or the hollow plate 120, a laminar flow forming an equally uniform flow maintaining a horizontal direction may be effectively formed on the substrate 10.

The exhaust part 230 may exhaust a process residue in the reaction tube 210 from the other side of the reaction tube 210. That is, the exhaust part 230 may exhaust a process residue in the reaction tube 210 through a suction hole 231 provided to the reaction tube 210. Also, the process residue may include an unreacted gas and a reaction by-product. Here, the exhaust part 230 may exhaust the process residue and form a vacuum in the reaction tube 210. The exhaust part 230 may be provided to the reaction tube 210 in symmetric to the injection nozzle 221, and the suction hole 231 may be provided to correspond to the plurality of injection nozzles 221. Here, the suction hole 231 may be disposed in symmetric to the injection nozzle 221, and the number or shape of the suction hole 221 may be the same as that of the injection nozzle 221.

Also, when the injection nozzle 221 is provided in plurality, the suction hole 231 may be also provided in plurality. When a plurality of suction holes 231 are disposed in correspondence to a plurality of injection nozzles 221, the process residue including an unreacted gas and a reaction by-product may be effectively exhausted, and the flow of the process gas may be effectively controlled. That is, the laminar flow may be formed by the injection nozzle 221 of the gas supply part 220 and the suction hole 231 of the exhaust part 230, which are symmetric to each other, and the process gas may be uniformly supplied to the entire surface of the substrate 10 by the laminar flow that forms the equally uniform flow maintaining the horizontal direction. Accordingly, the uniform substrate processing may be performed on the entire surface of the substrate 10.

The process gas may include a thin film deposition raw gas and an etching gas. That is, the substrate processing apparatus 200 in accordance with an exemplary embodiment may be a selective epitaxial growth (SEG) apparatus. Such a SEG apparatus mixes a small amount of etching gas with the thin-film deposition raw gas and supplies the same to the substrate 10, so that a deposition reaction and an etching reaction are accompanied together on the substrate 10. The deposition and etching reactions simultaneously occur at relatively different reaction rates with respect to a polycrystalline layer and an epitaxial layer. While a typical polycrystalline layer or a typical amorphous layer is deposited on at least one second layer during the deposition process, although the epitaxial layer is formed on a single crystalline surface, the deposited polycrystalline layer is generally etched at a faster speed than that of the epitaxial layer. Thus, as the etching gas is varied in concentration, a net selective process may result in deposition of an epitaxy material and limited or non-limited deposition of a polycrystalline material. For example, the SEG apparatus may form an epilayer made of a silicon contained material on a single crystalline silicon surface without remaining a deposition material on a spacer.

Figure 2:
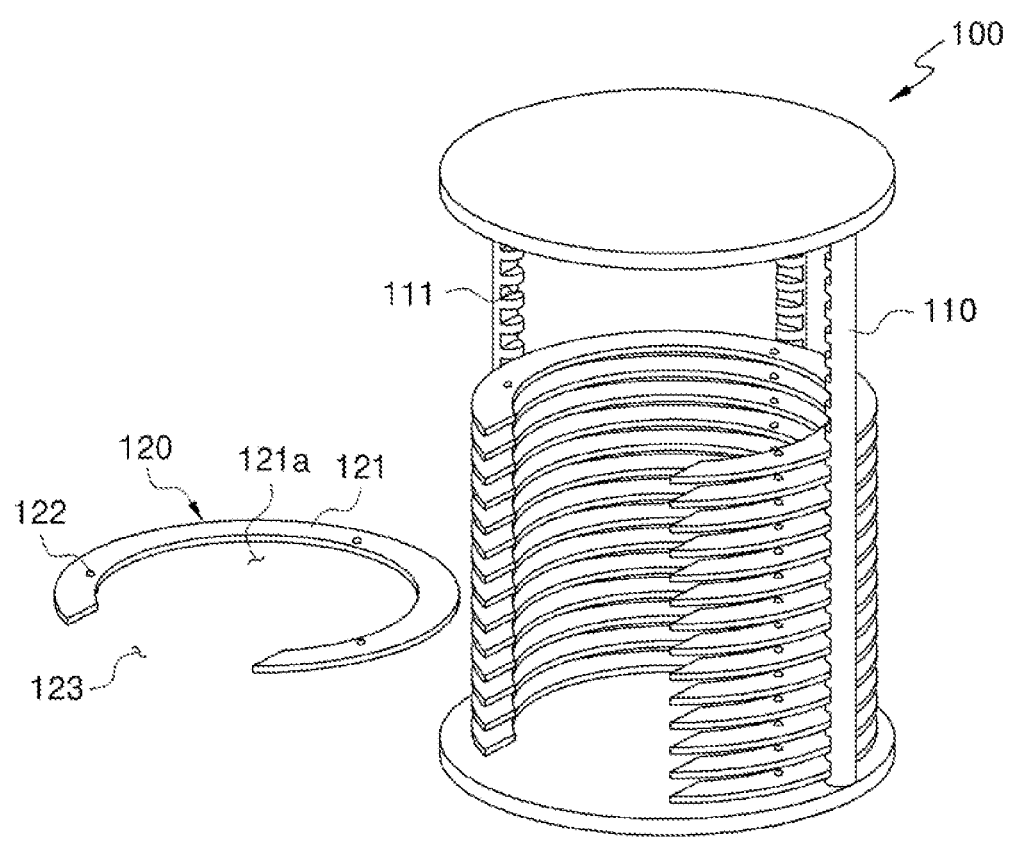
FIG. 2 is a view of a substrate boat in accordance with an exemplary embodiment.

FIG. 2 is a view of a substrate boat apparatus in accordance with an exemplary embodiment.

Referring to FIG. 2, the hollow plate may include an edge portion 121 forming a hollow portion 121a vertically passing therethrough. The edge portion 121 may be formed along an edge of the substrate 10 with a predetermined width and have a shape varied according to the shape of the substrate 10. Here, the edge portion 121 may be a frame provided on an edge of the hollow portion 121a, a rim completely surrounding the hollow portion 121a, and a brim surrounding a portion of the hollow portion 121a. For example, when the substrate 10 is a circular wafer, the edge portion may have a circular ring shape or a ring shape in which one side is cut.

Also, the edge portion 121 may extend along an edge of the substrate 10. Here, the hollow portion 121a may a shape that is at least partially the same as that of the substrate 10. When the edge portion 121 extends along the edge of the substrate 10, the edge portion 121 may be provided below the edge of the substrate 10. Also, when the edge of the substrate 10 is supported to reduce particles generated from a central portion of the substrate 10, particles generated from a lower portion of the edge of the substrate 10 due to a mark of contact such as friction when the substrate 10 is supported may be blocked not to fall onto the lower substrate 10.

Meanwhile, when the edge portion 121 supports the substrate 10, the edge portion 121 may be provided below the edge of the substrate 10 so that particles caused by a mark of contact such as friction is not generated from a central portion of the substrate 10 to stably support the edge of the substrate 10. Also, when an entire area of the substrate 10 is used, the hollow portion 121a may have a shape that is the same as that (or a portion of the shape) of the substrate 10 to stably support the substrate 10, effectively block the particles generated from the lower portion of the edge of the substrate 10, and minimize (or reduce) the surface area of the lower substrate 10, which is affected by the particles generated from the lower portion of the edge portion 121.

Also, the edge portion 121 may be symmetrically formed. Here, the edge portion 121 may be symmetric with respect to a horizontal central axis (or a horizontal line passing through the center of the substrate) of the substrate. In this case, the process gas may be uniformly supplied to both sides of the substrate 10 with respect to the horizontal central axis of the substrate 10 to form a laminar flow on the substrate 10. Accordingly, the phenomenon, in which a thin-film (or growth layer) has thicknesses different for each area of the substrate 10, may be prevented, and a uniform thin-film over the entire surface of the substrate 10 may be achieved. Meanwhile, when the edge portion 121 is asymmetrically formed, the process gas may be ununiformly supplied to the both sides of the substrate 10 with respect to the horizontal central axis of the substrate 10, so that the laminar flow is not formed on the substrate 10 Meanwhile, when the edge portion 121 supports the substrate 10, the substrate 10 may be stably supported by the both sides of the horizontal central axis of the substrate 10.

Also, the hollow plate 120 may further include a plurality of support pins 122 provided on a top surface of the edge portion 121 to support the substrate 10. The plurality of support pins 122 may be provided on the top surface of the edge portion 121, and the plurality of support pins 122 may be supported by the plurality of support pins 122. Here, the plurality of support pins 122 may include three or more support pins and be arranged (or spaced a predetermined distance) suitable according to a center of gravity of the substrate 10 to stably support the substrate 10. For example, the support pin 122 may have a semi-spherical shape and point-contact the substrate 10. In this case, a contact area with the substrate 10 may be minimized to minimize the generation of particles caused by a mark of contact (or friction), which are generated from the lower portion of the substrate 10.

Meanwhile, the support pin 122 may be formed to have a low height (e.g., about 1 mm) by which the substrate 10 is stably supported and the process gas does not pass between the bottom surface of the substrate 10 and the top surface of the edge portion 121. When the support pin 122 has the low height, the flow of the process gas below the substrate 10 may be blocked (or restrained) to effectively form the laminar flow on the substrate 10, and the effect the process gas on the thin-film deposition of the lower substrate 10 may be blocked (or restrained). Also, as the process residue caused by the process gas is not easily attached between the bottom surface of the substrate 10 and the top surface of the edge portion 121, the generated amount of the particles may be reduced. Also, when the support pin 122 has a wide surface area, the substrate 10 may be stably supported and prevented from being slipped.

Also, the support pin 122 may contact a portion recessed by a predetermined distance inward in an outer circumferential edge to support the substrate 10, and accordingly, stably support the substrate 10. Also, as the support pin 122 is spaced a predetermined distance from an inner side of the edge portion 121, the particles generated from the lower portion of the substrate 10 and falling on the lower substrate 10 due to the mark of contacting the support pin 122 may be effectively blocked by the edge portion 121. Here, the edge portion 121 has the inner side that is close to the hollow portion 121 and the outer side that is away from the hollow portion 121a. Meanwhile, when the support pin 122 is disposed too close to the inner side of the edge portion 121, the particles generated from the lower portion of the substrate 10 and falling on the lower substrate 10 due to the mark of contacting the support pin 122 may not be blocked by the edge portion 121.

Through the above-described hollow plate 120, the particles generated from the lower portion of the substrate 10 and falling on the lower substrate 10 due to the mark of contacting the support pin 122 when the substrate 10 is loaded or unloaded may not be blocked, and accordingly, the pollution of the lower substrate 10 due to the particles may be prevented.

Figure 3:
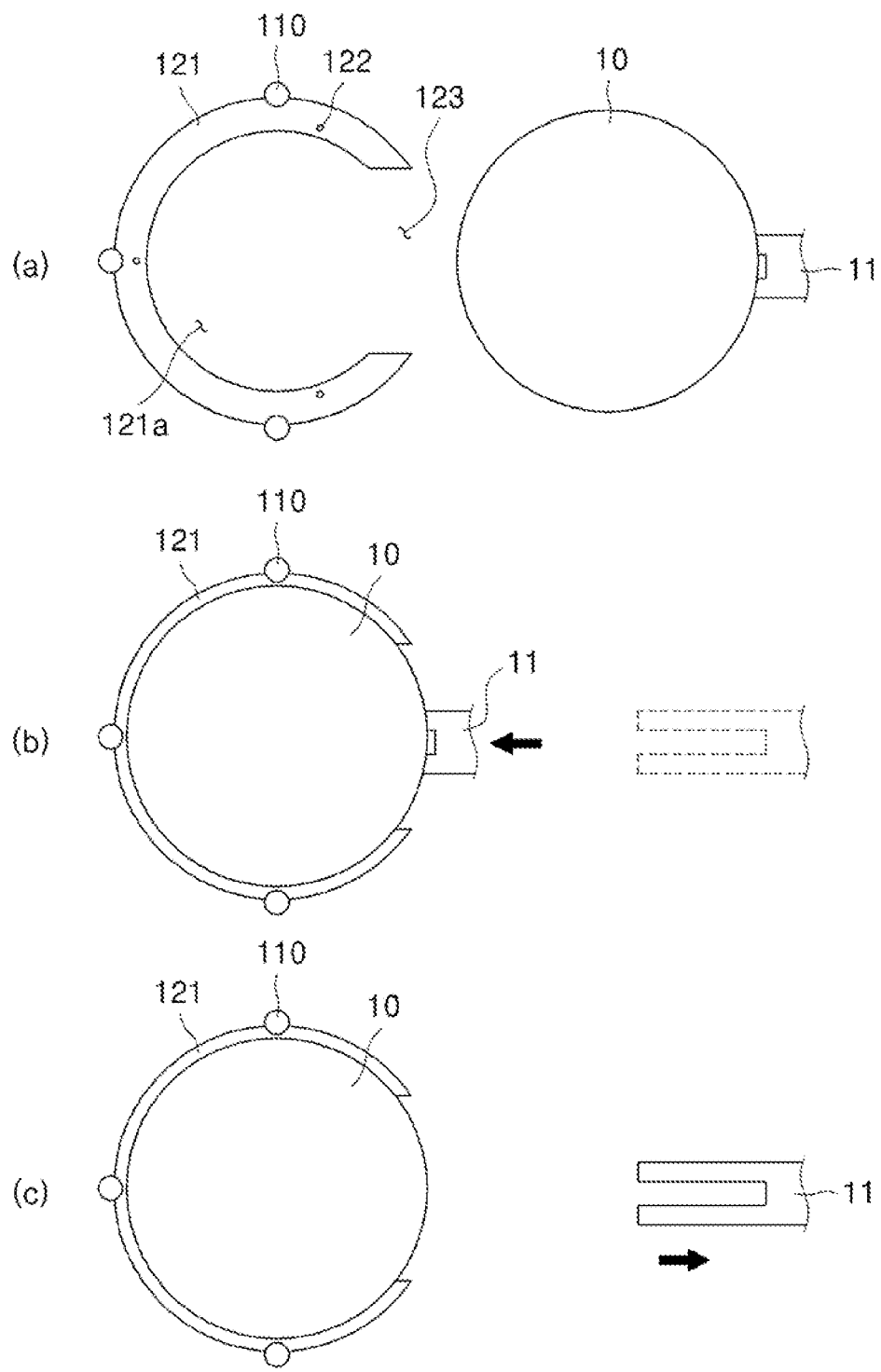
FIG. 3 is a conceptual view for explaining a cut portion of a hollow plate in accordance with an exemplary embodiment.

FIG. 3 is a conceptual view for explaining a cut portion of a hollow plate in accordance with an exemplary embodiment, (a) of FIG. 3 is a view illustrating a state in which a substrate is disposed on an arm of transfer equipment, (b) of FIG. 3 is a view illustrating a state in which the arm of the transfer equipment moves to provide the substrate to the hollow plate, and (c) of FIG. 3 is a view illustrating a state in which the arm of the transfer equipment allows the substrate to be supported by the hollow plate, and then moves out.

Referring to FIG. 3, the hollow plate 120 may further include the cut portion 123 in which at least one side of the edge portion 121 is opened. The cut portion 123 may be formed such that at least one side of the edge portion 121 is opened. Here, a direction in which the substrate 10 is loaded (or unloaded) in the edge portion 121 may be opened. Through the above-described cut portion 123, a space in which an arm 11 of the transfer equipment vertically moves may be secured, and interference with the hollow plate 120 when the arm 11 of the transfer equipment loads or unloads the substrate 10 may not be generated. Accordingly, the substrate 10 may be disposed (or loaded) on the hollow plate 120 as low as possible. Here, the hollow plate 120 may be a hoof plate (or hoof-shaped plate). The hollow plate may form a hoof shape such that one side of the hollow plate 120 having a circular shape (or an oval shape) is opened through the cut portion 123. Also, as a surface area of the hollow plate 120 overlapping (or invading) the lower substrate 10 is reduced through the cut portion 123, a falling range of particles falling from the bottom surface of the hollow plate 120 onto the surface of the lower substrate 10 may be reduced. Here, the overlap represents that two objects vertically overlap (or stack) one another regardless of a distance between the two objects.

Also, when the process gas is supplied in a direction of the cut portion 123, the hollow plate 120 may not be interfered when the process gas is injected, so that a laminar flow of the process gas may be effectively formed on the substrate 10. Meanwhile, although the cut portion 123 is provided in plurality to minimize a surface area of the hollow plate 120 overlapping the lower substrate 10, one cut portion 123 may be desired to stably support the substrate 10.

Figure 4:
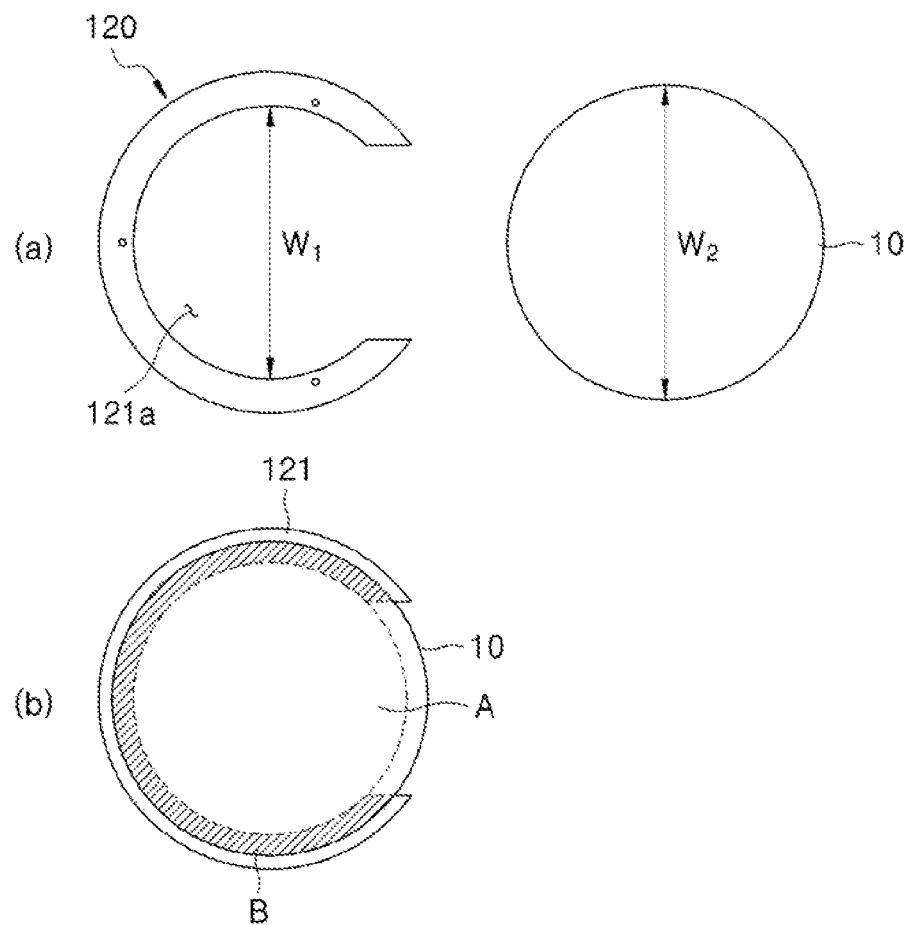
FIG. 4 is a conceptual view for explaining a shape of a hollow plate in accordance with an exemplary embodiment.

FIG. 4 is a conceptual view for explaining a shape of the hollow plate in accordance with an exemplary embodiment, (a) of FIG. 4 illustrates a width of a hollow portion and a width of a substrate, and (b) of FIG. 4 illustrates a surface area of the hollow portion and a surface area of a portion of an edge portion, which overlaps the substrate.

Referring to FIG. 4, a surface area A of the hollow portion 121a may be greater than a portion of the edge portion 121 overlapping the substrate 10. That is, the surface area A of the hollow portion 121a may be greater than a surface area in which the edge portion 121 overlaps the lower substrate 10 (or a surface area in which the edge portion coincides with the substrate).

When a semiconductor process is performed in a state in which a plurality of substrates are loaded on the substrate boat, particles may be generated from the lower portion of the substrate as well as the bottom surface of the plate used to support the substrate or divide the process space, and such particles may pollute the surface of the lower substrate. In particular, since the deposition and the etching are repeated in the SEG process, as the process residue attached to the bottom surface of the plate during the deposition process is etched during the etching process, particles may be further generated.

Accordingly, a surface area A of the hollow portion 121a may be greater than a surface area B of a portion of the edge portion 121 overlapping the substrate 10. Through this, the surface area in which the edge portion 121 overlaps the lower substrate 10 may be reduced, and the particles generated from the bottom surface of the hollow plate 120 and falling onto the lower substrate 10 are reduced to restrain the pollution of the lower substrate 10 due to the particles. That is, as the surface area in which the edge portion 121 overlaps the substrate 10 is reduced, a main factor causing the particles falling onto the substrate 10 may be reduced (or eliminated) to prevent or restrain the pollution of the surface of the substrate 10.

Also, the hollow portion 121a may have a width $W_1$ that is 75% to 97% of a width $W_2$ of the substrate 10. That is, a width in which the edge portion 121 invades the lower substrate 10 may be less than the width $W_1$ of the hollow portion 121a. When the width $W_1$ of the hollow portion 121a is less than 75% of the width $W_2$ of the substrate 10, as the surface area in which the edge portion 121 overlaps the substrate 10 is too large, the pollution of the surface of the substrate 10 due to the particles becomes severe, and a process failure rate increases. Meanwhile, when the width $W_1$ of the hollow portion 121a is greater than 97% of the width $W_2$ of the substrate 10, as the substrate 10 is not stably supported by the support pin 122, and a distance between the inner side of the edge portion 121 and the support pin 122 unavoidably decreases, the particles falling from the lower portion of the substrate 10 to the surface of the lower substrate 10 due to a mark of contacting the support pin 122 may not be effectively blocked.

For example, when the width $W_2$ of the substrate 10 is about 300 mm, the width $W_1$ of the hollow portion 121a may be about 260 mm, and the edge portion 121 may invade inward the both sides of the substrate 10 by about 20 mm In this case, the substrate 10 may be effectively supported, the particles generated from the lower portion of the substrate 10 due to the mark of contacting the support pin 122 and falling onto the surface of the lower substrate 10 may be effectively blocked, and a tolerance range of the particles generated from the bottom surface of the edge portion 121 and falling onto the surface of the lower substrate 10 may be reduced.

Meanwhile, the substrate 10 may be divided into a use area (or growth area) that is the central portion and a non-use area (or non-growth area) that is the edge portion. Here, as the edge portion 121 is allowed to invade only the non-use area of the substrate 10, the particles generated from the bottom surface of the edge portion 121 may not affect the use area of the substrate 10. Here, the hollow portion 121a may have a shape that is different from that of an outer side of the edge portion 121. For example, the outer side shape of the edge portion 121 may be a circular shape according to the shape of a circular wafer, and the hollow portion 121a may have a shape of a rectangular inscribed in the circular wafer (i.e., circle formed by the circular wafer). In general, when the circular wafer is divided into rectangular unit chips, an edge portion from which a rectangular shape is not made is dumped. The edge portion 121 may be allowed to invade (or cover) only the edge portion.

Also, the substrate 10 may be a single crystal containing a first element, and the thin-film deposition raw gas may contain the first element. Here, the hollow plate 120 may be made of a material different from that of the substrate 10. Here, the different material may be a different element, a homogeneous element having a different crystalline structure such as an amorphous structure or a polycrystalline structure, and a composite element such as an oxide and a nitride containing the same element. For example, the first element may include silicon (Si), and the hollow plate 120 may be made of quartz (e.g., $SiO_2$).

In this case, the first element may be well deposited as a thin-film on the substrate 10, grown on the substrate 10 in an epitaxial manner, and well deposited as a thin-film on the bottom surface of the substrate 10. Accordingly, the particles generated such that the thin-film (or deposited material) of the first element deposited on the bottom surface of the substrate 10 is fallen form the bottom surface of the substrate 10 may be restrained or prevented. That is, as a nucleation position of a single crystal constituting a lattice on the substrate 10 (or on the bottom surface of the substrate 10) is provided, the first element may be deposited on the nucleation position in a form of a thin-film, and the first element may be grown in the same lattice structure (or lattice constant) to stably maintain the deposited thin-film (or growth layer) of the first element on the substrate 10. Meanwhile, in case of a different material, as the nucleation position for depositing the thin-film of the first element is not provided, the first element is attached to a surface in a form of particles or a lump, and the attachment may be stably maintained.

Meanwhile, a native oxide may be formed on the bottom surface of the substrate 10. Since the native oxide is extremely thin to have a thickness of several □, the nucleation position may be provided on a surface of the native oxide, and the native oxide may be etched in the SEG process. When the nucleation position is provided on the surface of the native oxide, the first element may be deposited in the form of the thin-film on the nucleation position provided on the surface of the native oxide of the bottom surface of the substrate 10. When the native oxide is etched by the etching of the SEG process, the first element may be deposited in the form of the thin-film on the bottom surface of the substrate 10 exposed by etching of the native oxide. For example, the native oxide may be formed on a bottom surface of a silicon wafer. Here, silicon may be deposited (or grown) on the surface of the native oxide on which the nucleation position is provided, and the silicon may be deposited on bare silicon of the bottom surface of the silicon wafer exposed by being etched due to the etching of the SEG process.

Also, when the hollow plate 120 is made of a material different from that of the substrate 10, since the hollow plate 120 is formed of a different element or an amorphous or polycrystalline material, the first element may not be deposited in the form of the thin-film on the hollow plate 120 (or the bottom surface of hollow plate) and attached onto the hollow plate 120 as a process by-product in the form of a lump (or particles), and the attached process by-product may not be stably maintained on the hollow plate 120. In particular, the process by-product attached to the bottom surface of the hollow plate 120 may be detached from the surface of the hollow plate 120 during the substrate processing process or etched during the SEG process to act as particles. The particles may fall on the lower substrate 10 to affect a thin-film quality of the lower substrate 10. That is, the hollow plate 120 may not constitute a lattice in which the first element is able to grow and may not provide the nucleation position. Accordingly, the first element may not be deposited in the form of the thin-film on the hollow plate 120 and attached onto the hollow plate 120 as a process by-product. Since the first element is attached onto the hollow plate 120 as the process by-product, the first element may be easily etched by the etching of the SEG process to act as particles. Also, the process by-product attached on the bottom surface of the hollow plate 120 may fall from the surface of the hollow plate 120 during the substrate processing process to act as particles.

That is, due to a different between deposition characteristics (e.g., deposition rate) and/or etching characteristics (e.g., etching rate) according to materials of the substrate 10 and the hollow plate 120, although the deposition and the etching are repeated in the SEG process, the particles may not be generated in the substrate 10 among the substrate and the hollow plate 120, and the particles may be generated only in the hollow plate 120. In particular, the particles are generated from the bottom surface of the hollow plate 120.

As described above, the particles caused by the thin-film deposition of the first element may not be generated in the substrate 10, and the particles caused by the process by-product generated by the first element may be generated only in the hollow plate 120. Accordingly, the surface area of the substrate 10 overlapping the lower substrate 10 may increase, and the surface area of the hollow plate 120 overlapping the lower substrate 10 may decrease. That is, as the surface area in which the edge portion 121 overlaps the lower substrate 10 decreases, the substrate 10 from which the particles are not generated further overlaps (or coincides) the substrate 10, and the hollow plate 120 from which the particles are generated less overlaps the lower substrate 10 to restrain the pollution of the lower substrate 10 due to the particles falling onto lower substrate 10.

In general, in the SEG process, the thin-film is deposited (or grown) by using the thin-film deposition raw gas containing the same element as that of the substrate 10 on the substrate 10 formed of single crystal of the constituent element. However, when the hollow plate 120 is made of a material different from that of the substrate 10 like the exemplary embodiment, as the thin-film deposition raw gas (or deposition material) is well deposited (or adsorbed) in the form of the thin-film on the substrate 10 formed of the same single crystalline element, and the thin-film deposition raw gas is not deposited in the form of the thin-film on the hollow plate 120 that is amorphous or polycrystalline or formed of a different element, the particles are generated only from the hollow plate 120 less overlapping the lower substrate 10, and more particles are generated from the bottom surface of the hollow plate 120.

For example, the substrate 10 may be a single crystalline silicon wafer, the thin-film deposition raw gas may include a silicon gas, and silicon may be grown on the single crystalline silicon wafer (i.e., the above-described substrate) in an epitaxial manner. Here, the hollow plate 120 may be made of quartz, the process by-product in the form of amorphous silicon may be attached to the hollow plate 120, and the attached amorphous silicon is easily detached from the hollow plate 120.

Also, a plurality of slots 111 into which the plurality of hollow plates 120 are inserted may be respectively defined in the plurality of rods 110. When the plurality of hollow plates 120 are inserted into and coupled to the plurality of slots 111, the plurality of hollow plates 120 may be coupled to the plurality of rods 110 in a simple and stable manner. Also, the plurality of hollow plates 120 may be detached from the plurality of rods 110, and, in this case, maintenance of the hollow plates 120 such as cleaning may be easily performed.

Also, alignment of the plurality of hollow plates 120 is important to achieve a uniform thin-film on the plurality of substrates 10. The plurality of hollow plates 120 may be aligned through the plurality of slots 111. For example, the plurality of hollow plates 120 may be aligned in such a manner that a protruding portion or a recessed portion (or groove) is defined in a portion of the hollow plate 120, into which the slot 111 is inserted, and a recessed portion or a protruding portion is provided in correspondence thereto, so as to be engaged with each other. Also, as an align marker is provided on the hollow plate 120, and the hollow plate 120 is inserted into the slot 111 in match with the align marker, the plurality of hollow plates 120 may be aligned.

Meanwhile, as a recessed portion is defined in a portion of the hollow plates 120, which is coupled to the plurality of rods 120, and the plurality of hollow plates 120 are coupled to the plurality of rods 110 so that the plurality of rods 110 are inserted into the recessed portion, the plurality of hollow plates 120 may be aligned.

Also, the rod 110 may be disposed at an outer side of the edge portion 121, and the plurality of support pins 122 may be disposed at a central portion between the outer side and the inner side of the edge portion 121 or disposed closer to the inner side than the outer side of the edge portion 121. That is, the substrate 10 may be spaced apart from and supported by the rod 110 so that the edge is sufficiently away from the rod 110. In this case, as the substrate 10 is spaced apart form the rod 110, the particles generated from the rod 110 is prevented from falling onto the surface of the substrate 10, and the phenomenon in which thicknesses are different for each area of the substrate by the rod 100 may be prevented.

In other words, when the particles generated from the rod 110 including the slot 111 fall onto the surface of the substrate, since the rod 110 is disposed to face the injection direction of the process gas such as the thin-film deposition raw gas and has a length (or height), more process by-products may be attached thereto, and thus, more particles than other components (or portions) are generated. In general, the rod 110 is made of a material (e.g. quartz) different from that of the thin-film deposition raw gas. In particular, in the SEG process, the deposition and the etching are repeated to generate more particles from the rod 110. Accordingly, as the substrate 10 is spaced apart from the rod 110, such particles may be prevented from falling onto the surface of the substrate 10. Also, the rod 110 may disturb the flow of the process gas and affect the flow of the process gas when the substrate 10 is disposed adjacent to the rod 110, so that the flow of the process gas is ununiform for each area of the substrate 10, and the substrate 10 has thicknesses different for each area. In case of spacing the substrate apart from the rod 110, such a limitation may be resolved.

Figure 5:
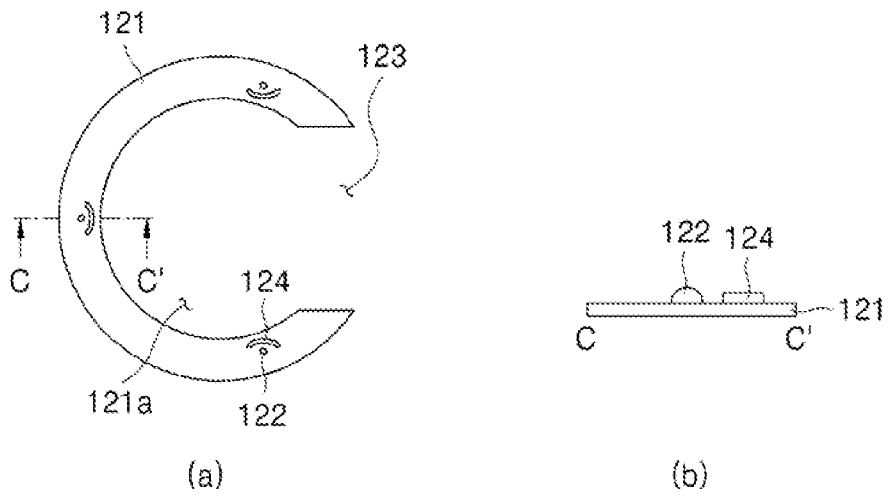
FIG. 5 is a view illustrating a modified example of a hollow plate in accordance with an exemplary embodiment.

FIG. 5 is a view illustrating a modified exampled of the hollow plate in accordance with an exemplary embodiment, (a) of FIG. 5 is a plan view of the hollow plate, and (b) of FIG. 5 is a cross-sectional view taken along line C-C'.

Referring to FIG. 5, the hollow plate 120 may further include a plurality of blocking walls 124 disposed more inside than the support pin 122 on the top surface of the edge portion 121 in respective correspondence to the plurality of support pins 122 The plurality of blocking walls 124 may be provided in respective correspondence to the plurality of support pins 122 and disposed more inside than the support pins 122 on the top surface of the edge portion 121. Also, each of the blocking walls may prevent the particles generated from the lower portion of the substrate 10 due to the mark of contact such as friction with the support pin 122 from moving inside the edge portion 121 to prevent the particles falling on the lower substrate 10 through the hollow portion 121a disposed at the inner side of the edge portion 121. Meanwhile, the blocking wall may be disposed at only the inner side of the edge portion 121 among the surrounding (or peripheral portion), and, in this case, the particles may be discharged through the exhaust part 230 disposed at the outer side of the edge portion 121.

Also, the blocking wall may have a height less than that of the support pin 122. When the blocking wall 124 has a height greater than that of the support pin 122, the substrate 10 is not supported by the support pin 122. When the blocking wall 124 has a height equal to that of the support pin 122, the substrate 10 is also supported by the blocking wall 124, and thus, particles due to a mark of contacting the blocking wall 124 are generated. In this case, more amount of particles are generated, and the particles fall on the surface of the lower substrate 10 through the hollow portion 121a disposed at an inner side of the edge portion 121 because the blocking wall 124 is disposed adjacent to the inner side of the edge portion 121. To prevent this, the blocking wall 124 may have a height greater than that of the support pin 122.

Also, when the blocking wall 124 has a height less than that of the support pin 122, the blocking wall 124 may not completely block the horizontal flow (or flow path) of the process gas, and thus, the process gas supplied to each substrate 10 may not affect the lower substrate 10. When the horizontal flow of the process gas is completely blocked by the blocking wall 124, since an upward portion is blocked by the bottom surface of the substrate 10, the process gas flows downward. Also, when the horizontal flow of the process gas is maintained, the particles may be discharged through the exhaust part 230 to the outside of the edge portion 121.

The substrate processing apparatus 200 in accordance with an exemplary embodiment may further include a chamber 240 in which the reaction tube 210 is accommodated. The chamber 240 may have a shape of a rectangular container or a cylinder and have an inner space. Also, the chamber 240 may include an upper chamber and a lower chamber, and the upper chamber and the lower chamber may be communicated with each other. An insertion hole 241 communicated with a transfer chamber 300 may be defined at one side of a lower portion of the chamber 240, and, through the insertion hole 241, the substrate 10 may be loaded into the chamber 240 from the transfer chamber 300. An inlet 310 may be defined in one side of the transfer chamber 300 in correspondence to the insertion hole 241 of the chamber 240, and a gate valve 320 may be provided between the inlet 310 and the insertion hole 241. Accordingly, the inner space of the transfer chamber 300 and the inner space of the chamber 240 may be separated by the gate valve 320. Also, the inlet 310 and the insertion hole 241 may be opened and closed by the gate valve 320, and here, the insertion hole 241 may be defined in the lower portion of the chamber.

Also, a shaft 251 may be connected to a lower portion of the substrate boat 100. The shaft 251 may vertically extend and have an upper end connected to the lower portion of the substrate boat 100. The shaft 251 may serve to support the substrate boat 100, and a lower portion of the shaft 251 may pass through the lower portion of the chamber 240 and connected to an external vertical movement driving part (not shown) or a rotation driving part (not shown).

The substrate processing apparatus 200 in accordance with an exemplary embodiment may further include a support plate 260 installed to the shaft 251. The support plate 260 may be installed to the shaft 251 and ascend together with the substrate boat 100 to seal a processing spaced in the inner reaction tube 211 or the outer reaction tube 212 from the outside. The support plate 260 may be spaced apart below the substrate boat 100. A sealing member 261 having an O-ring shape may be provided between the support plate 260 and the inner reaction tube 211 or between the support plate 260 and the outer reaction tube 212 to seal the processing space. Also, a bearing member 262 may be provided between the support plate 260 and the shaft 251, and the shaft 251 may rotate while being supported by the bearing member 262.

The substrate processing apparatus 200 in accordance with an exemplary embodiment may further include a heater 270 disposed in the chamber 240. The heater 270 may be provided in the chamber 240 and disposed to surround a side circumference and an upper portion of the inner reaction tube 211 or the outer reaction tube 212. The heater 270 may provide thermal energy to the inner reaction tube 211 or the outer reaction tube 212 to heat the inner space of the inner reaction tube 211 or the outer reaction tube 212 and adjust a temperature of the inner space of the inner reaction tube 211 or the outer reaction tube 212 to perform the epitaxial process.

The substrate processing apparatus in accordance with the exemplary embodiment may block the particles falling on the surface of the lower substrate, which is caused by a mark of contact such as friction when the substrate is loaded or unloaded through the hollow plate, and, accordingly, preventing pollution of the lower substrate. Also, as the surface area in which the hollow plate overlaps the lower substrate is minimized, particles falling from the bottom surface of the hollow plate onto the surface of the lower substrate may be reduced.

Also, as the arm of transfer equipment is vertically movable through the cut portion of the hollow plate, interference when the substrate is loaded or unloaded may not be generated, the particles generated from the rod may be prevented from falling on the surface of the substrate by spacing the substrate apart from the rod through the plurality of support pins defined on the top surface of the hollow plate, and the phenomenon, in which the thickness for each area of the substrate is varied because of the rod, may be prevented. Meanwhile, when the total support surface area of the plurality of support pins is extended, the substrate may be stably supported, and the slip of the substrate may be prevented. Also, as the height of the support pin increases, the process reside is not easily attached between the lower surface of the substrate and the top surface of the edge portion, at which the substrate is supported, and thus, the generated amount of the particles may be reduced. Also, when the rod and the hollow plate are welded, the structural stability may be enhanced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Hence, the real protective scope of the present invention shall be determined by the technical scope of the accompanying claims.

What is claimed is:

1. A substrate processing apparatus comprising:
   a substrate boat comprising a plurality of hollow plates coupled to a plurality of rods in a multistage manner, wherein a plurality of substrates are respectively loaded on the plurality of hollow plates;
   a reaction tube having an accommodation space in which the substrate boat is accommodated;
   a gas supply part configured to supply a process gas into the reaction tube from one side of the reaction tube; and
   an exhaust part configured to exhaust a process residue in the reaction tube from the other side of the reaction tube,
   wherein the plurality of hollow plates define a hollow portion vertically passing therethrough, and
   wherein each of the plurality of hollow plates comprises:
   a plurality of support pins provided on a top surface of the respective hollow plates to support the substrate; and
   a plurality of blocking walls respectively provided at a surrounding portion of the respective support pins on the top surface of the respective hollow plates, and disposed at an inner side, which is closer to the hollow portion than the respective support pins, on the top surface of the respective hollow plates.

2. The substrate processing apparatus of claim 1, wherein each of the plurality of blocking walls has a height less than that of the support pin.

3. The substrate processing apparatus of claim 1, wherein each of the plurality of hollow plates further comprises a cut portion in which at least one side thereof is opened.

4. The substrate processing apparatus of claim 1, wherein the respective hollow plates extends along an edge of the substrate.

5. The substrate processing apparatus of claim 1, wherein the hollow portion has an area that is greater than that of a portion of the respective hollow plates, which overlaps the loaded substrate.

6. The substrate processing apparatus of claim 1, wherein the process gas comprises a thin-film deposition raw gas and an etching gas.

7. The substrate processing apparatus of claim 6, wherein the substrate is a single crystal containing a first element, and
   the thin-film deposition raw gas contains the first element.

8. The substrate processing apparatus of claim 1, wherein a plurality of slots, into which the plurality of hollow plates are inserted, are respectively defined in the plurality of rods.

9. The substrate processing apparatus of claim 1, wherein each of the plurality of blocking walls is spaced apart from each of the plurality of support pins.

10. The substrate processing apparatus of claim 1, wherein each of the plurality of blocking walls is disposed on the top surface of a respective one of the plurality of hollow plates at a location laterally between the hollow portion and a respective one of the plurality of support pins.

\* \* \* \* \*